US012574052B2

(12) United States Patent
Wesel et al.

(10) Patent No.: US 12,574,052 B2
(45) Date of Patent: Mar. 10, 2026

(54) NEURAL-NETWORK-OPTIMIZED DEGREE-SPECIFIC WEIGHTS FOR LDPC MINSUM DECODING

(71) Applicants: THE REGENTS OF THE UNIVERSITY OF CALIFORNIA, Oakland, CA (US); CALIFORNIA INSTITUTE OF TECHNOLOGY, Pasadena, CA (US)

(72) Inventors: Richard D. Wesel, Manhattan Beach, CA (US); Linfang Wang, Los Angeles, CA (US); Sean Chen, Los Angeles, CA (US); Dariush Divsalar, Pacific Palisades, CA (US); Jonathan Nguyen, Los Angeles, CA (US)

(73) Assignees: The Regents of the University of California, Oakland, CA (US); California Institute of Technology, Pasadena, CA (US)

( * ) Notice: Subject to any disclaimer, the term of this patent is extended or adjusted under 35 U.S.C. 154(b) by 12 days.

(21) Appl. No.: 18/240,162

(22) Filed: Aug. 30, 2023

(65) Prior Publication Data

US 2024/0154626 A1    May 9, 2024

Related U.S. Application Data

(63) Continuation of application No. PCT/US2022/018945, filed on Mar. 4, 2022.

(Continued)

(51) Int. Cl.
*H03M 13/11*         (2006.01)
(52) U.S. Cl.
CPC .............................. *H03M 13/1111* (2013.01)

(58) Field of Classification Search
CPC ...................... H03M 13/1111; H03M 13/6597
See application file for complete search history.

(56) References Cited

U.S. PATENT DOCUMENTS

| | | | | |
|---|---|---|---|---|
| 10,861,562 | B1 * | 12/2020 | Xiong .................... | G11C 16/10 |
| 2020/0099401 | A1 * | 3/2020 | Qin ................... | H03M 13/2906 |
| 2021/0110241 | A1 * | 4/2021 | Tullberg ............ | H03M 13/1111 |

FOREIGN PATENT DOCUMENTS

| | | | |
|---|---|---|---|
| WO | WO-2019213947 A1 * | 11/2019 | |
| WO | 2022187651 A1 | 9/2022 | |

OTHER PUBLICATIONS

International Preliminary Report on Patentability for International Application No. PCT/US2022/018945, Report issued Aug. 29, 2023, Mailed Sep. 14, 2023, 7 pgs.

(Continued)

*Primary Examiner* — Cynthia Britt
(74) *Attorney, Agent, or Firm* — KPPB LLP

(57) ABSTRACT

Neural Normalized MinSum (N-NMS) decoding for improving frame error rate (FER) performance on linear block codes over conventional normalized MinSum (NMS). Dynamic multiplicative weights are assigned to each check-to-variable message in each iteration to efficiently provide training parameters of N-NMS that support N-NMS for longer block lengths. Embodiment are described for neural two-dimensional normalized MinSum (N-2D-NMS) decoders requiring fewer training parameters. The N-2D-NMS approaches for example use the same weight for edges with the same check and/or variable node degree. Simulation results indicate that that this LDPC decoding performs similarly to previous techniques while substantially reducing the amount of training necessary.

16 Claims, 8 Drawing Sheets

Related U.S. Application Data

(60) Provisional application No. 63/157,061, filed on Mar. 5, 2021.

(56) References Cited

OTHER PUBLICATIONS

International Search Report and Written Opinion for PCT International Application No. PCT/US2022/018945, Completed Jul. 19, 2022, Mailed Aug. 15, 2022, 13 pgs.

"Published Codes and Design Tools", UCLA Communications Systems Laboratory, Retrieved from internet: http://www.seas.ucla.edu/csl/#/publications/published-codes-and-design-tools, 2020, Retrieved on Mar. 26, 2025, 4 pgs.

Abotabl et al., "Offset min-sum Optimization for General Decoding Scheduling: A Deep Learning Approach", IEEE 90th Vehicular Technology Conference (VTC2019-Fall), Sep. 2019, pp. 1-5, doi: 10.1109/VTCFall.2019.8891434.

Anastasopoulos, "A comparison between the sum-product and the min-sum iterative detection algorithms based on density evolution", IEEE Global.

Telecommunications Conference (Cat. No. 01CH37270), vol. 2, 2001, pp. 1021-1025, doi: 10.1109/GLOCOM.2001.965572.

Buchberger et al., "Pruning and Quantizing Neural Belief Propagation Decoders", IEEE Journal on Selected Areas in Communications, vol. 39, No. 7, Jul. 2021, pp. 1957-1966, doi: 10.1109/JSAC.2020.3041392.

Chen et al., "Protograph-Based Raptor-Like LDPC Codes", IEEE Transactions on Communications, vol. 63, No. 5, May 2015, pp. 1522-1532, doi: 10.1109/tcomm.2015.2404842.

Deng et al., "Reduced-Complexity Deep Neural Network-Aided Channel Code Decoder: A Case Study for BCH Decoder", IEEE International Conference on Acoustics, Speech and Signal Processing (ICASSP), 2019, pp. 1468-1472, doi: 10.1109/ICASSP.2019.8682871.

Liang et al., "An Iterative BP-CNN Architecture for Channel Decoding under Correlated Noise", IEEE Journal of Selected Topics in Signal Processing, vol. 12, No. 1, Feb. 2018, pp. 144-159, doi: 10.1109/JSTSP.2018.2794062.

Lugosch et al., "Learning from the Syndrome", 52nd Asilomar Conference on Signals, Systems and Computers, 2018, pp. 594-598, doi: 10.1109/ACSSC.2018.8645388.

Lugosch et al., "Neural Offset Min-Sum Decoding", IEEE International Symposium on Information Theory (ISIT), 2017, pp. 1361-1365, doi: 10.1109/ISIT.2017.8006751.

Lyu et al., "Performance Evaluation of Channel Decoding With Deep Neural Networks", IEEE International Conference on Communications (ICC), 2018, pp. 1-6, doi: 10.1109/ICC.2018.8422289.

Nachmani et al., "Deep Learning Methods for Improved Decoding of Linear Codes", IEEE Journal of Selected Topics in Signal Processing, vol. 12, No. 1, Feb. 2018, pp. 119-131, doi: 10.1109/JSTSP.2017.2788405.

Nachmani et al., "Learning to Decode Linear Codes Using Deep Learning", 54th Annual Allerton Conference on Communication, Control, and Computing (Allerton), Monticello, IL, USA, 2016, pp. 341-346, doi: 10.1109/ALLERTON.2016.7852251.

Nachmani et al., "RNN Decoding of Linear Block Codes", arXiv:1702.07560v1 [cs.IT], Feb. 24, 2017, 7 pgs.

Preacher et al., "Choosing the Optimal Number of Factors in Exploratory Factor Analysis: A Model Selection Perspective", Multivariate Behavioral Research, vol. 48, No. 1, 2013, pp. 28-56, doi: 10.1080/00273171.2012.710386.

Rissanen, "Order Estimation by Accumulated Prediction Errors", Journal of Applied Probability, vol. 23, 1986, pp. 55-61, doi: 10.2307/3214342.

Wang et al., "A Model-Driven Deep Learning Method for Normalized Min-Sum LDPC Decoding", IEEE International Conference on Communications Workshops (ICC Workshops), Jun. 2020, pp. 1-6, doi: 10.1109/ICCWorkshops49005.2020.9145237.

Wang et al., "Neural-Network-Optimized Degree-Specific Weights for LDPC MinSum Decoding", arXiv, arXiv:2107.04221, Jul. 9, 2021, 5 pgs.

Werbos, "Generalization of Backpropagation with Application to a Recurrent Gas Market Model", Neural networks, vol. 1, No. 4, Jan. 1988, pp. 339-356, doi: 10.1016/0893-6080(88)90007-x.

Wu et al., "Decoding Optimization for 5G LDPC Codes by Machine Learning", IEEE Access, vol. 6, Sep. 10, 2018, pp. 50179-50186, doi: 10.1109/ACCESS.2018.2869374.

Xiao et al., "Finite alphabet iterative decoding of LDPC codes with coarsely quantized neural networks", IEEE Global Communications Conference (Globecom), 2019, pp. 1-6, doi: 10.1109/GLOBECOM38437.2019.9013364.

Zhang et al., "Improved Min-Sum Decoding of LDPC Codes Using 2-Dimensional Normalization", IEEE Global Telecommunications Conference, vol. 3, 2005, 6 pgs., doi: 10.1109/GLOCOM.2005.1577841.

* cited by examiner

30

Channel Observation — 32

Compute Variable-to-Check-Node Messages — 34

Compute Check-to-Variable-Node Messages — 36

Variable Nodes Update Beliefs based on Messages — 38

Do new beliefs follow parity check rules ? — 40

No

Yes

Has the maximum number of iterations been reached ? — 42

No

Yes

Finish Decoding — 44

NEURAL-NETWORK-OPTIMIZED DEGREE-SPECIFIC WEIGHTS FOR LDPC MINSUM DECODING

CROSS-REFERENCE TO RELATED APPLICATIONS

This application claims priority to, and is a 35 U.S.C. § 111(a) continuation of, PCT international application number PCT/US2022/018945 filed on Mar. 4, 2022, incorporated herein by reference in its entirety, which claims priority to, and the benefit of, U.S. provisional patent application Ser. No. 63/157,061 filed on Mar. 5, 2021, incorporated herein by reference in its entirety. Priority is claimed to each of the foregoing applications.

The above-referenced PCT international application was published as PCT International Publication No. WO 2022/187651 A1 on Sep. 9, 2022, which publication is incorporated herein by reference in its entirety.

STATEMENT REGARDING FEDERALLY SPONSORED RESEARCH OR DEVELOPMENT

This invention was made with government support under Grant No. 80NMO0018D0004 awarded by NASA (JPL) and under Grant Number 1911166, awarded by the National Science Foundation. The government has certain rights in the invention.

NOTICE OF MATERIAL SUBJECT TO COPYRIGHT PROTECTION

BACKGROUND

1. Technical Field

The technology of this disclosure pertains generally to Low-Density Parity Check (LDPC) error correction coding, and more particularly to a neural implementation with optimized weighting of the check to variable node and variable to check node during LDPC MinSum decoding.

2. Background Discussion

An LDPC Code is a Low-Density Parity Check (LDPC) code which is a class of Forward Error Correction (FEC) codes commonly used in communication systems. LDPC codes are utilized in Wi-Fi, cellular networks, deep-space communication systems, storage systems such as flash memory, and other applications.

As is common with error correction codes, LDPC codes attain error correction by transmitting redundant parity bits along with the desired information bits. Moreover, LDPC codes are classified as block-codes meaning that they encode and decode a fixed number of bits at a time. A LPDC code will encode "k" bits at a time into "n" bits. The variable "n" is referred to the blocklength of the code and denotes how many bits will be transmitted. Additionally, because k bits enter the LDPC encoder and n bits exit, the LDPC code has added n-k redundant parity bits. As a rule of thumb, the more parity bits that are added, the better the code can correct errors. However, the effective data rate decreases as more bits are allocated to error correction rather than useful information. To describe this, all LDPC codes have an associated rate: the proportion of useful information bits to the total blocklength. In mathematical terms, the rate is defined as k/n; and can range from 0 to 1. With higher rates, more data is sent within each block. However, higher rates have a reduced capability to correct errors as compared to lower rates, and so are typically reserved for instances which are subject to less interference or noise.

As a simple illustration of how parity bits can correct errors, consider the example below for the repetition code. Using a repetition code, each bit is simply repeated a specified number of times. Due to noise, some of the incoming bits may be flipped (inverted in which a 0 becomes a 1, or a 1 becomes a 0). Therefore, the most likely bit is the one that appears the most often. It should be appreciated that the repetition code is not a type of LDPC code, it is only being mentioned as an example of error correction coding in general.

$$1 \rightarrow 11111 \rightarrow 11001 \rightarrow 1$$

In the first step the bit 1 is repeated five times to encode it. Then, due to noise, the third and fourth bits experience errors and so they are shown flipped. To decode the repetition code, the value that appears the most times is chosen. In this case, despite the two errors caused by bit flips, the repetition code was able to correctly decode the incoming message.

As one can imagine, simply repeating the same bit some number of times is an inefficient use of bits. Therefore, typical error correction codes add parity bits carefully and according to a set of rules unique to that code.

Error correction codes like LDPC codes encode k bits to an n bit codeword through a generator matrix. This creates the n-k parity bits, each of which must follow some rule. The ones and zeros corresponding to the n bits are represented as numerical values such as +/−1 that are modulated and transmitted over a channel. The channel corrupts the modulated values with noise and/or interference so that the received demodulated value is not equal to the transmitted value.

The received values are converted into values that represent the likelihood that the transmitted bit is a one or a zero. More noise and interference cause the likelihood values to be less favorable. LDPC decoders use iteratively passing messages on a bipartite graph to process the reliabilities to determine the best estimate of the transmitted codeword. To check whether a valid possible codeword has been identified, a parity check matrix (typically denoted as H) is used.

The performance of message passing can be improved by multiplying the messages by scale factors (weights). In general, each edge in the bipartite graph can have a different weight. Recently, neural networks have been used to find favorable weights for each edge in the bipartite graph. However, this neural network approach requires significant memory and training toward achieving suitable results.

Accordingly, the present disclosure provides high levels of LPDC decoder performance with reduced training requirements by constraining the neural network to use the same weight for edges that connect to nodes that have the same degree.

BRIEF SUMMARY

A decoder apparatus for a low-density parity-check (LDPC) code is described in which variable nodes are connected to check nodes and messages are passed between the variable nodes and check nodes. A neural network (NN) is utilized for assigning the weights for at least a portion of the messages being passed. More specifically, messages having the same degree for one or more specified nodes are constrained to have the same weight for the same iteration. Either or both check-to-variable messages and variable-to-check messages may be determined by the NN. In some embodiments, messages having the same check node degree and/or variable node degree are constrained to have the same weight. In other embodiments, messages having both the same variable node degree and the same check node degree are constrained to have the same weight.

Simulations were performed which validated the ability of the system to perform LDPC decoding with good performance while requiring significantly fewer training parameters than the prior art.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

1. Introduction to Message Passing

It has been established that a parity check matrix H can be used to check if the received codeword is valid. However, it has been proven and shown that the same parity check matrix can be used to also correct for those errors using message passing on the bipartite graph determined by the parity matrix.

Figure 1:
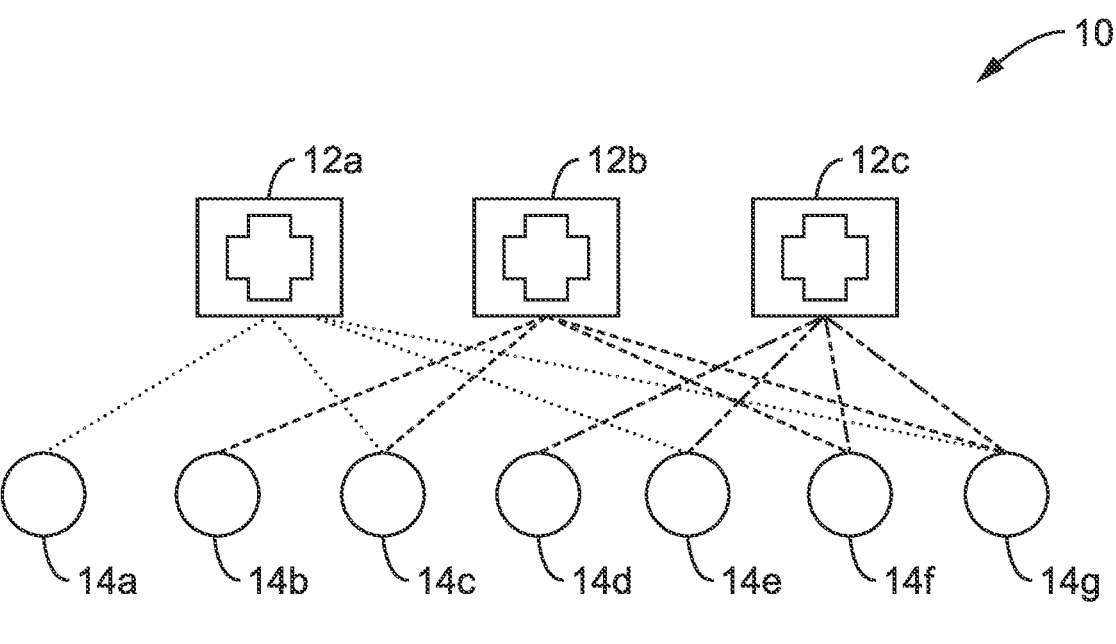
FIG. 1 is a bipartite graph depicting variable nodes and check nodes of a bipartite graph representation of a low-density parity-check (LDPC) code according to an embodiment of the present disclosure.

FIG. 1 illustrates an example embodiment 10 of a bipartite graph for the following parity-check matrix.

$$\begin{bmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{bmatrix}$$

To correct for errors in a LDPC code, an algorithm known "message passing" is utilized. From the parity check matrix, a bipartite graph (also known as a Tanner graph) is created, which has two types of nodes in the graph. Circles $14a$ through $14f$ are "variable nodes" which represent each of the "n" bits that were received and are to be decoded. Squares $12a$ through $12c$ represent "check nodes", each of which represent a rule that any valid codeword must follow. If a line, also called an "edge", is drawn between a variable and check node as seen in the figure by the differently shaded lines, that indicates (means) that the variable node is involved in the rule implemented by that check node.

Each row in the parity-check matrix corresponds to a check node in the bipartite graph. Each column in the parity matrix corresponds to a variable node in the bipartite graph. Each edge in the bipartite graph corresponds to a one in the parity-check matrix.

Both variable and check nodes have an associated "degree", which indicates how many edges are connected to it. In the figure below, the leftmost variable node $14a$ has a degree of 1. Meanwhile the leftmost check node $12a$ has a degree of 4.

In actual applications, each variable node is only connected to a relatively small number of check nodes resulting in a relatively small number of ones in the parity-check matrix. This saves in computation time and is where "Low-Density" Parity Check codes derive their name. FIG. 1 depicts a somewhat higher-density graph only for illustrative purposes to show how a bipartite graph is related to its corresponding parity-check matrix.

When the receiver initially receives a codeword that has been corrupted by noise and/or interference, it calculates a measure of what each bit is likely to be. Later in this document, this measure will be further described as a "Log Likelihood Ratio" (LLR). At a high level, an LLR greater than 0 means that the bit is more likely to be a 0. Conversely, a LLR that is negative means that the bit is more likely to have been a 1. The more positive the LLR, the more confident the decoder is that the bit was 0, and vice-versa for a more negative LLR.

Due to noise during transmission, some variable nodes (received bits) will have LLRs of the wrong sign. However, there will also be several variable nodes that are quite confident in their values. Therefore, the goal of message passing is for these high-confidence correct variable nodes to correct errors in low-confidence and incorrect variable nodes.

To perform message passing, first, each variable node receives an estimate of its value directly from what the receiver observes. Then, each variable node sends a message to its connected check node. The message represents what each variable node believes its value is. Next, each check node takes in all its messages and performs a rule check. Depending on whether its parity check rule is satisfied by its incoming messages and the confidence of the incoming messages, the check node then sends a message back to its variable nodes. The resulting "check to variable node message" will weaken or strengthen the variable node's belief in its value. If the resulting change in belief causes all bits to satisfy the parity check rules, decoding is completed. However, if it does not, the decoding process continues until a maximum number of message-passing iterations has been performed.

Figure 2:
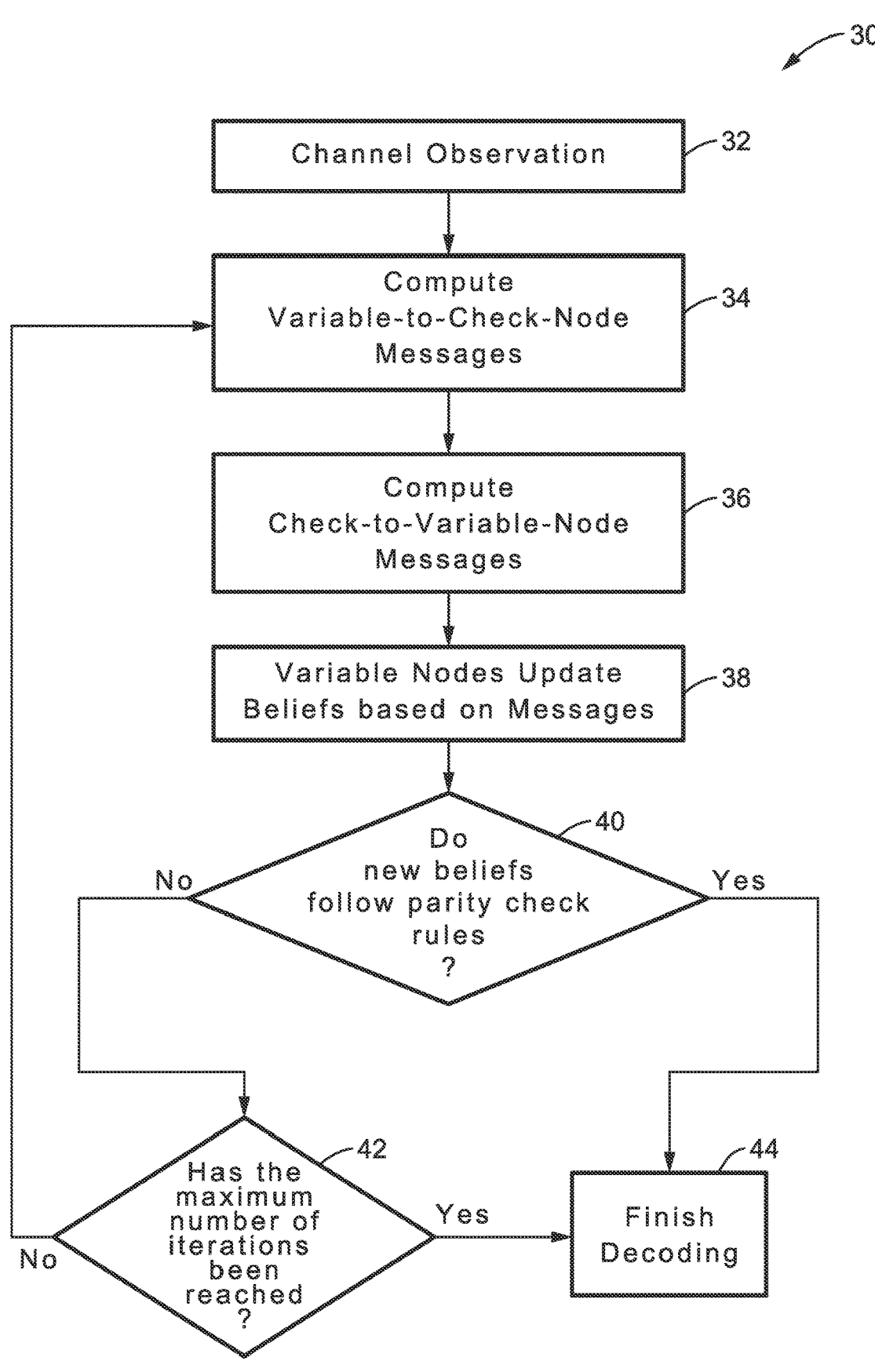
FIG. 2 is a flow diagram of a message passing process according to an embodiment of the present disclosure.

FIG. 2 illustrates a general embodiment 30 of this LDPC message-passing decoding. In block 32 Channel Observation is performed in which Variable nodes receive estimates directly from the channel observations. In block 34 Variable-to-Check-Node Messages are computed by the variable nodes and sent by variable nodes to their neighboring check nodes. In block 36 Check-to-Variable-Node Messages are computed by the check nodes and sent by check nodes to their neighboring variable nodes. In block 38 the variable nodes update their beliefs through a process in which, based on its check to variable node messages, each variable node updates its belief about its bit value. In block 40 a decision is represented of a Syndrome Check that determines if all the updated beliefs follow all parity check rules. If the decision is YES, then this indicates at block 44 that decoding is completed (finished). Otherwise, the decision is NO at block 42. If a maximum number of iterations has already been reached, then the process is inconclusive and comes to an end; otherwise, the process continues at block 34.

One of the important distinctions of the present disclosure is in the weighting of the check-to-variable node and variable-to-check node messages. In each iteration, a Normalized MinSum (NMS) decoder uses the same constant value to scale all check-to-variable node messages, whereas a Neural Normalized Minsum (N-NMS) decoder assigns distinct multiplicative parameters for each check-to-variable message in each iteration. Instead of weighing each message by the same multiplicative factor, such as in Minsum, NMS, or Belief Propagation (BP) or having every edge have a distinct multiplicative parameter as in N-NMS, the present teachings involve training a neural network for optimizing dynamic multiplicative weights that can change with each iteration and are constrained by the variable node degree and or the check node degree.

2. Training the Weights of the N-NMS Decoder

Figure 3:
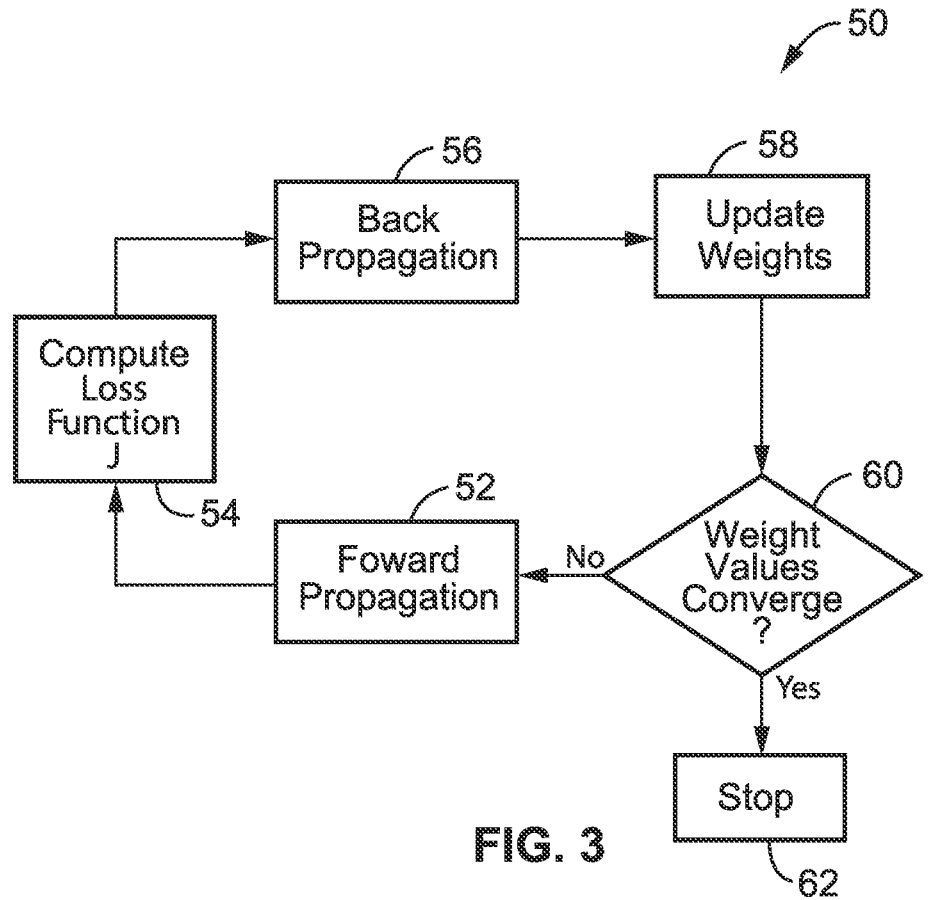
FIG. 3 is a flow diagram describing a training process for a neural network according to an embodiment of the present disclosure.

FIG. 3 illustrates an example embodiment 50 of a process by which a neural network trains the weights of the N-NMS decoder. The first step in training the weights of the N-NMS decoder is forward propagation 52. Forward propagation is similar to the message passing operations of the decoder, except that the message passing does not stop when the parity-check equations are satisfied. Instead, forward propagation continues passing messages until a maximum number of iterations are performed. The posteriors computed in previous forward propagation steps are then used in block 54 to compute the loss function J. The loss function is used by Back Propagation 56. During Back Propagation the neural network calculates the gradient of the loss function J with respect to the edge weights. Then, the edge weights are adjusted based on the gradient in block 58. The neural network training alternates between forward propagation and backward propagation. Block 60 checks at each iteration whether the weights have converged. When the weights have converged, the neural network concludes training in block 62.

2.1. Forward Propagation

The first step in training the weights of a Neural Normalized Minsum (N-NMS) decoder is forward propagation. Let H be the parity check matrix of an (n, k) LDPC code, where n and k represent the codeword length and dataword length, respectively. By way of example and not limitation, $v_i$ and $c_j$ are utilized to denote the $i^{th}$ variable node and $j^{th}$ check node, respectively. In the $t^{th}$ forward propagation iteration, N-NMS updates the check-to-variable node message, $u_{c_j \to v_i}^{(t)}$, the variable-to-check node message, $l_{v_j \to c_j}^{(t)}$, and posterior of each variable node, $l_{v_i}^{(t)}$ by the equations:

$$u_{c_i \to v_j}^{(t)} = \beta_{(c_i,v_j)}^{(t)} \times \prod_{v_{j'} \in N(c_i)/\{v_j\}} sgn\left(l_{v_{j'} \to c_i}^{(t-1)}\right) \times \min_{v_{j'} \in N(c_i)/\{v_j\}} \left|\left(l_{v_{j'} \to c_i}^{(t-1)}\right)\right| \quad (1)$$

$$l_{v_j \to c_i}^{(t)} = l_{v_i}^{ch} + \sum_{c_{i'} \in N(v_j)/\{c_i\}} u_{c_{i'} \to v_j}^{(t)} \quad (2)$$

$$l_{v_j}^{(t)} = l_{v_i}^{ch} + \sum_{c_{i'} \in N(v_j)} u_{c_{i'} \to v_j}^{(t)}. \quad (3)$$

$N(c_i)$ represents the set of variable nodes that are connected to $c_i$ and $N(v_j)$ represents the set of check nodes that are connected to $v_j \cdot l_{v_j}^{ch}$ which is the LLR of channel observation of $v_j \cdot \beta_{(c_i,v_j)}^{(t)}$ that are multiplicative weights to be trained. The forward propagation process stops when a maximum number of iterations $I_T$ is reached.

2.2. Back Propagation

Back propagation is used by the neural network to train the weights used in the N-NMS LDPC decoder. In this subsection is derived a gradient that is used in Backward propagation. Consider the gradient of the loss function J with respect to the trainable weights, $$\frac{\partial J}{\partial \beta_{(v_i,c_j)}^{(t)}},$$

the check-to-variable message, $$\frac{\partial J}{\partial u_{c_i \to v_j}^{(t)}},$$

and variable-to-check message, $$\frac{\partial J}{\partial l_{v_j \to u_i}^{(t)}}.$$

It is shown that in order to calculate the desired gradients, it is sufficient only to store, $1_{v_i}^{(t)}$, $\text{sgn}(1_{v_j \to c_i}^{(t)})$, $\text{sgn}(u_{c_i \to v_j}^{(t)})$, min $1_{c_i}^t$, min $2_{c_i}^t$, $\text{pos}1_{c_i}^t$ and $\text{pos}1_{c_i}^t$ when performing forward propagation, where:

$$\min 1_{c_i}^t = \min_{v_{j'} \in N(c_i)} \left| l_{v_{j'} \to c_i}^{(t)} \right| \tag{4}$$

$$pos1_{c_i}^t = \min_{B_{v_{j'} \in N(c_i)}} \left| l_{v_{j'} \to c_i}^{(t)} \right| \tag{5}$$

$$\min 2_{c_i}^t = \min_{v_{j'} \in N(c_i)/\{pos1_{c_i}^{(t)}\}} \left| l_{v_{j'} \to c_i}^{(t)} \right| \tag{6}$$

$$pos2_{c_i}^t = \min_{v_{j'} \in N(c_i)/\{pos1_{c_i}^{(t)}\}} \left| l_{v_{j'} \to c_i}^{(t)} \right|. \tag{7}$$

In the present disclosure, multi-loss cross entropy is used as a loss function J to train the neural network:

$$J = \frac{1}{N} \sum_{t=1}^{IT} \sum_{v_j=1}^{N} \left( x_{v_j} \log \sigma\left(l_{v_j}^{(t)}\right) + \left(1 - x_{v_j}\right) \log\left(1 - \sigma\left(l_{v_j}^{(t)}\right)\right) \right), \tag{25}$$

where $\sigma(x) = \frac{1}{1+e^{-x}}$.

In iteration $$t, \frac{\partial J}{\partial l_{v_j \to u_i}^{(t)}}$$

is updated as follows:

$$\frac{\partial J}{\partial u_{c_i \to v_j}^{(t)}} = \frac{\partial J}{\partial l_{v_j}^{(t)}} + \sum_{c_{i'} \in N(v_j)/\{c_i\}} \frac{\partial J}{\partial l_{v_j \to c_{i'}}^{(t)}} \tag{8}$$

$$\frac{\partial J}{\partial \beta_{c_i \to v_j}^{(t)}}$$

is calculated by:

$$\frac{\partial J}{\partial \beta_{c_i \to v_j}^{(t)}} = u_{c_i \to v_j}^{(t)*} \frac{\partial J}{\partial u_{c_i \to v_j}^{(t)}} \tag{9}$$

where:

$$u_{c_i \to v_j}^{(t)*} = \text{sgn}\left(u_{c_i \to v_j}^{(t)*}\right) \times \left| u_{c_i \to v_j}^{(t)*} \right| \tag{10}$$

$$\text{sgn}\left(u_{c_i \to v_j}^{(t)*}\right) = \prod_{v_{j'} \in \frac{N(c_i)}{v_j}} \text{sgn}\left(l_{v_{j'} \to c_i}^{(t-1)}\right) \tag{11}$$

$$\left| u_{c_i \to v_j}^{(t)*} \right| = \begin{cases} \min 2_{c_i}^t, & \text{if } v_j = pos1_{c_i}^t \\ \min 1_{c_i}^t, & \text{otherwise} \end{cases}. \tag{12}$$

With the chain rule, the following is obtained for $$\frac{\partial J}{\partial u_{c_i \to v_j}^{(t)}}:$$

$$\frac{\partial J}{\partial \left| u_{c_i \to v_j}^{(t)*} \right|} = \text{sgn}\left(u_{c_i \to v_j}^{(t)*}\right) \frac{\partial J}{\partial u_{c_i \to v_j}^{(t)*}} = \text{sgn}\left(u_{c_i \to v_j}^{(t)*}\right) \beta_{(c_i, v_j)}^{(t)} \frac{\partial J}{\partial u_{c_i \to v_j}^{(t)*}} \tag{13}$$

For all variable nodes connected to check node $c_i$, only $pos1_{c_i}^{(t)}$ and $pos2_{c_i}^{(t)}$ receive backward information, therefore, $$\frac{\partial J}{\partial l_{v_j \to c_i}^{(t-1)}}$$

can be computed as follows:

$$\frac{\partial J}{\partial l_{v_j \to c_i}^{(t-1)}} = \begin{cases} \text{sgn}\left(l_{v_j \to c_i}^{(t-1)}\right) \sum_{v_{j'} \in \frac{N(c_i)}{v_j}} \frac{\partial J}{\partial \left| u_{c_i \to v_{j'}}^{(t)*} \right|}, & v_j = pos1_{c_i}^{(t)} \\ \text{sgn}\left(l_{v_j \to c_i}^{(t-1)}\right) \frac{\partial J}{\partial \left| u_{c_i \to pos1_{c_i}^{(t)}}^{(t)*} \right|}, & v_j = pos2_{c_i}^{(t)} \\ 0, & \text{otherwise} \end{cases} \tag{14}$$

The above equations indicate that $$\frac{\partial J}{\partial u_{c_i \to v_j}^{(t)}} \text{ and } \frac{\partial J}{\partial l_{v_j \to c_i}^{(t)}}$$

can be calculated iteratively. Therefore, back propagation does not need to store the gradients with respect to $u_{c_i \to v_j}$ and $l_{v_j \to c_i}$ for all iterations. Commonly used neural network packages Pytorch and Tensorflow store all iterations of $u_{c_i \to v_j}^{(t)}$, $l_{v_j \to c_i}^{(t)}$ and $l_{v_j}^{(t)}$, making them inefficient for this purpose. However, it has been shown that the neuron values in each hidden layer can be stored compactly using the parameters $l_{v_j}^{(t)}$, $\text{sgn}(l_{v_j \to c_i}^{(t)})$, $\text{sgn}(u_{c_i \to v_j}^{(t)})$, min $1_{c_i}^t$, min $2_{c_i}^t$, $pos1_{c_i}^t$, and $pos2_{c_i}^t$ which results in a significant reduction in storage requirements. Using these two strategies, the Tensorflow storage obstacles are resolved.

2.3. Simulation Results

In this subsection, the efficient implementation described above is utilized during Neural Net (NN) training. By way of example and not limitation the weights of Neural Normalized Minsum (N-NMS), for a (3096,1032) protograph-based raptor-like (PBRL) LDPC code are computed. Encoded bits x are modulated by binary phase shift keying (BPSK) and transmitted through an Additive White Gaussian Noise (AWGN) Channel. The N-NMS decoder is updated on a flooding schedule and the maximum number of decoding iterations is 10 in this specific example. The example defines $\beta^{(t,d_c)} = \{\beta_{(c_i, v_j)}^{(t)} | \deg(c_i) = d_c\}$ and $\overline{\beta}^{(t,d_c)}$ as the mean value of $\beta^{(t,d_c)}$.

Figure 4:
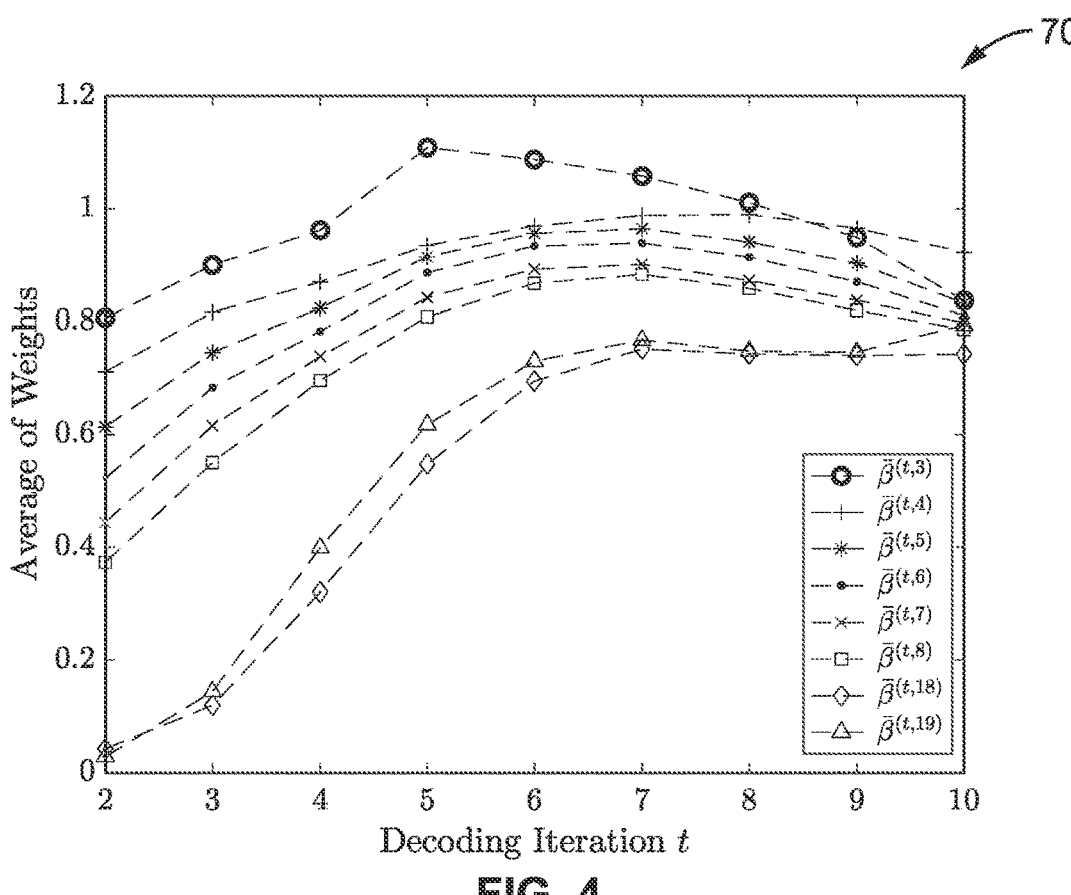
FIG. 4 is a plot showing averaged training weights with the same check node degree in each decoding iteration in an Field Network (FN) Non-Maximum Suppression (NMS) neural network model with a (3096,1032) PBRL code, as utilized according to an embodiment of the present disclosure.

FIG. 4 illustrates an example 70 of results showing average training weights that have the same check node degree in each decoding iteration. In the figure is seen $\overline{\beta}^{(t,d_c)}$ versus decoding iteration t with all possible check node degrees. Specifically, the figure shows $\overline{\beta}^{(t,3)}$, $\overline{\beta}^{(t,4)}$, $\overline{\beta}^{(t,5)}$, $\overline{\beta}^{(t,6)}$, $\overline{\beta}^{(t,7)}$, $\overline{\beta}^{(t,8)}$, $\overline{\beta}^{(t,18)}$ and $\overline{\beta}^{(t,19)}$.

It should be noted that the iteration number starts at 2 because most of the edges have 0 valued messages in the first iteration as the result of puncturing. The simulation shows a clear relationship between check node degree and $\bar{\beta}$, for instance larger check node degrees correspond to smaller $\bar{\beta}$. This difference is significant in the first few iterations. Additionally, $\bar{\beta}^{(t,d_c)}$ changes significantly in the first few iterations for all check node degrees $d_c$.

In order to investigate the relationship between weights and variable node degree, given a check node degree and iteration number, it is further defined that $\beta^{(t,d_c,d_v)}=\{\beta_{(c_i,v_j)}^{(t)}$ |deg($c_i$)=$d_c$, deg($v_i$)=$d_v$}. It is denoted that $\bar{\beta}^{(t,d_c,d_v)}$ is to be the average value of $\beta^{(t,d_c,d_v)}$, i.e., the values of the weights $\beta^{(t,d_c,d_v)}$ for all edges at time t with check node degree $d_c$ and variable node degree $d_v$ are averaged.

Figure 5:
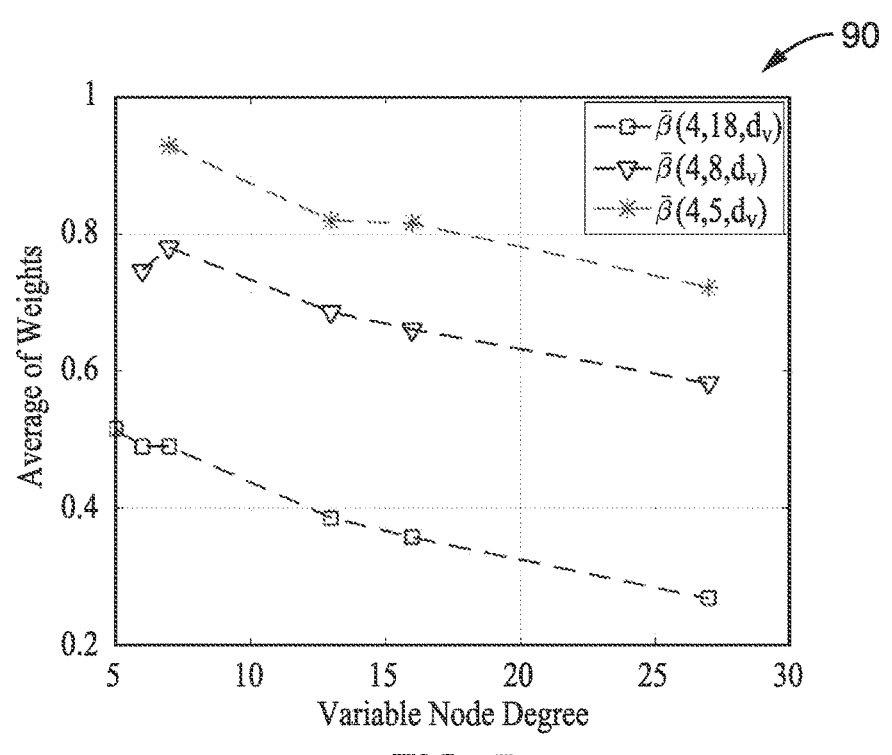
FIG. 5 is a plot showing averaged training weights with the same check node degree in a specific decoding iteration in an FNNMS neural network model with a (3096,1032) PBRL code as utilized according to an embodiment of the present disclosure.

FIG. 5 illustrates an example 90 of averaged training weights that have the same check and variable node degree in a specific decoding iteration for this neural network model. The figure shows the average value of weights corresponding to various check and variable node degrees at iteration 4. Simulation results show that, given a specific iteration t' and check node degree d'$_c$. Larger d'$_v$ correspond to smaller $\bar{\beta}^{(t',d'_c,d'_v)}$. Specifically, the plot shows variable node degree results for $\bar{\beta}^{(4,18,d_v)}$, $\bar{\beta}^{(4,8,d_v)}$ and $\bar{\beta}^{(4,5,d_v)}$.

In conclusion, in the present disclosure it has been discovered that the weights of N-NMS are correlated with check node degree, variable node degree, and iteration. Thus, node degrees should affect the weighting of messages on their incident edges when decoding irregular LDPC codes. Neural network decoders are becoming increasingly important, and the present disclosure proposes a mechanism for implementing a family of N-2D-NMS decoders.

3. Neural 2D Normalized MinSum Decoder

Based on the previous discussion, embodiments of the present disclosure constrain messages with the same check node degree and/or variable node degree to have the same weight. In this section is described embodiments of the invention referred to as neural two-dimensional normalized MinSum (N-2D-NMS) decoders, which have the following form:

$$u_{c_i \to v_j}^t = \beta_*^{(t)} \times \prod_{v_{j'} \in \frac{N(c_i)}{\{v_j\}}} \text{sgn}\left(l_{v_{j'} \to c_i}^{(t-1)}\right) \times \min_{v_{j'} \in \frac{N(c_i)}{\{v_j\}}} |l^{(t-1)}| \tag{15}$$

$$l_{v_j \to c_i}^{(t)} = l_{v_i}^{ch} + \alpha_*^{(t)} \overline{\sum_{c_{i'} \in \frac{N(v_j)}{\{c_i\}}} u_{c_{i'} \to v_j}^{(t)}} \tag{16}$$

where $\beta_*^{(t)}$ and $\alpha_*^{(t)}$ are the multiplicative weights assigned to check and variable node messages, respectively. Table 1 lists different types of N-2D-NMS decoders, each identified in the first column by a type number. As a special case, the prior art approach of N-NMS that does not constrain the edge weights based on the check node or variable node degree is included as Type 0. Columns 2 and 3 describe how each type assigns $\beta_*^{(t)}$ and $\alpha_*^{(t)}$ respectively. The subscript * is replaced in Table 1 with the information needed to identify the specific weight depending on the weight sharing methodology.

Types 1-4 are embodiments of the invention that constrain weight values based on node degrees. Type 1 constrains check-to-variable messages that have the same check node and variable node degree to have the same weight. Type 2 constrains check-to-variable messages to have a weight that is the product of two scale factors, where one factor $\beta$ is determined from the check node degree and the other factor $\alpha$ is determined from the variable node degree. Type 3 constrains check-to-variable messages that have the same check node degree to have the same weight. Type 4 constrains check-to-variable messages that have the same variable node degree to have the same weight. These same constraints could also be applied to variable-to-check messages.

Weight sharing has been studied based on the edge type of Multi-Edge-Type (MET) LDPC codes, or protograph-based codes, which is included as Type 5. Type 5 assigns the same weight to edges with the same edge type, for example edges that belong to the same position in the protomatrix. In Table 1, f is the lifting factor. Types 6 and 7 are embodiments of the present disclosure that reduce neural network training complexity by constraining weights based only on the horizontal (protomatrix row) or vertical layers (protomatrix column), respectively. Finally, Type 8 assigns a single weight parameter for each iteration.

To further reduce the number of parameters, the present disclosure considers a hybrid training structure that utilizes a neural network combining a feedforward module with a recurrent module. The corresponding decoder uses distinct trained parameters for each of the first I' decoder iterations and reuses the same parameters in the remaining $I_T$–I' iterations. The motivation for the hybrid decoder is that the values of the trainable parameters change negligibly during the last few iterations. Therefore, using the same parameters for the last few iterations doesn't cause a large performance degradation.

A (3096,1032) PBRL code and the (16200,7200) DVBS-2 standard LDPC code are considered in this disclosure, and the number of parameters per iteration required for various N-2D-NMS decoders of these two codes are listed in column 4 and 5 in Table 1, respectively. It is shown that the number of parameters required by node-degree based weight sharing is less than that required by protomatrix based weight sharing.

3.1. Simulation Results

In this section are illustrative results from investigating the decoding performance of various N-2D-NMS decoders for LDPC codes with different block lengths. All encoded bits are modulated by BPSK and transmitted through the AWGN channel.

3.2. Simulation Results for (16200,7200) DVBS-2 LDPC Code

Figure 6:
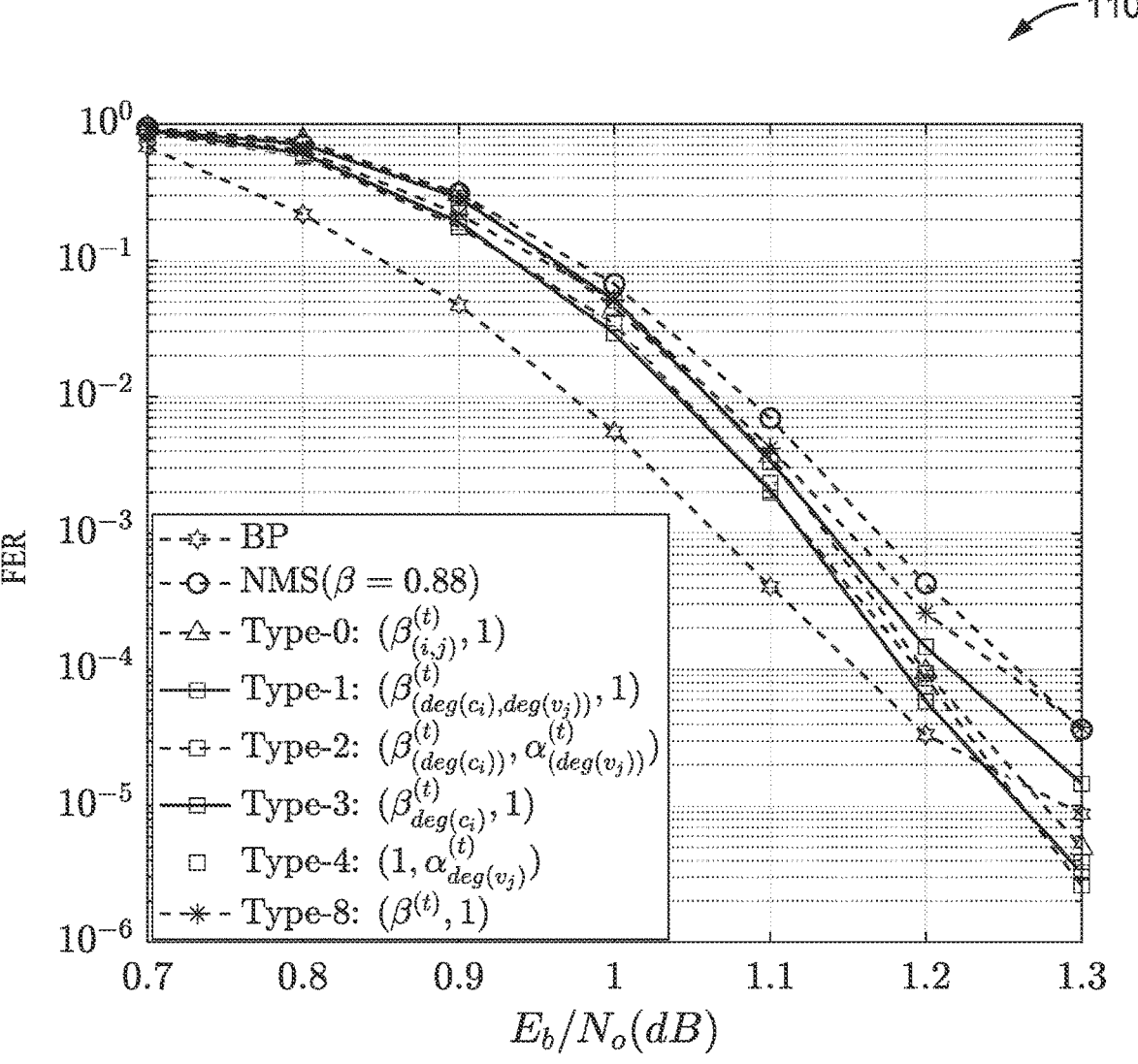
FIG. 6 is a plot of Frame Error Rate (FER) performances of various LDPC decoders for the (16200,7200) DVBS-2 LDPC code according to an embodiment of the present disclosure.

FIG. 6 illustrates an example 110 of FER performances of various LDPC decoders for (16200,7200) DVBS-2 LDPC code. Specifically, the figure depicts BP. NMS, type-0 through type-4 and type-8. All the decoders are flooding-scheduled and maximum decoding iteration is 50.

It is shown that the N-NMS decoder outperforms BP at 1.3 dB, with a lower error floor. The N-2D-NMS decoders of types 1 and 2 have a slightly better performance than N-NMS. Type 4 outperforms type 3, because the variable node weights of investigated code have a larger dynamic range than check node weights, as shown in the figure.

Figure 7:
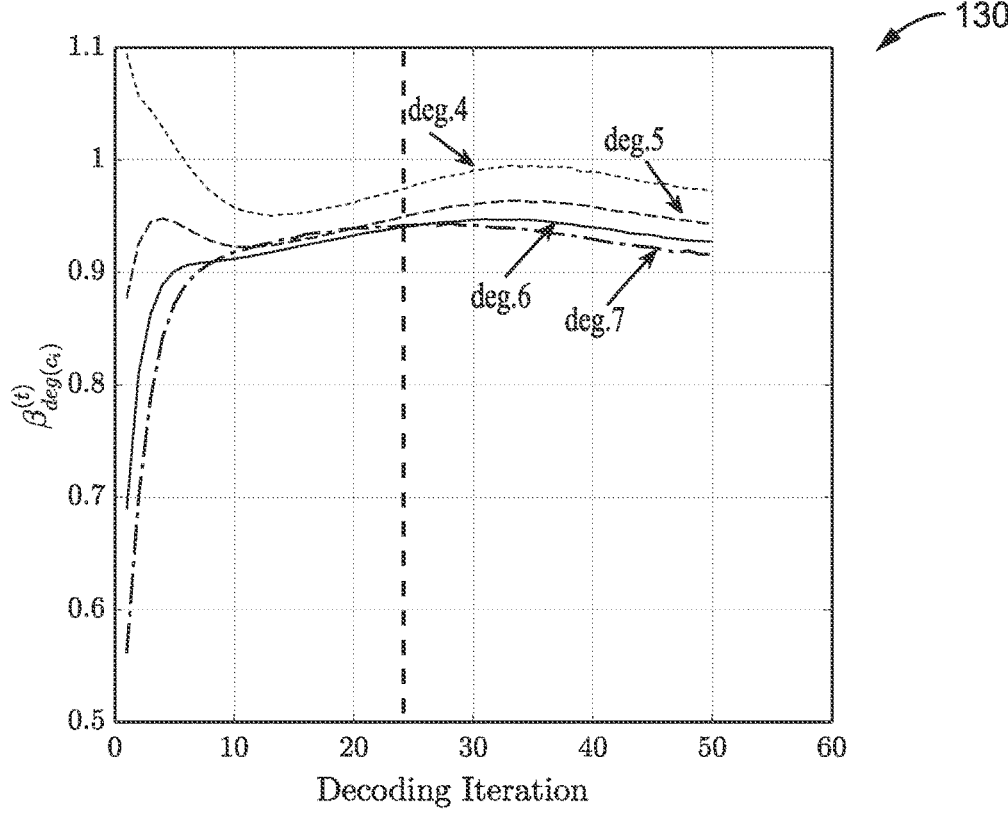
FIG. 7 and FIG. 8 are plots of training weights of the Type-2 N-2D-NMS decoder for (16200,7200) DVBS-2 LDPC code according to an embodiment of the present disclosure.
Figure 8:
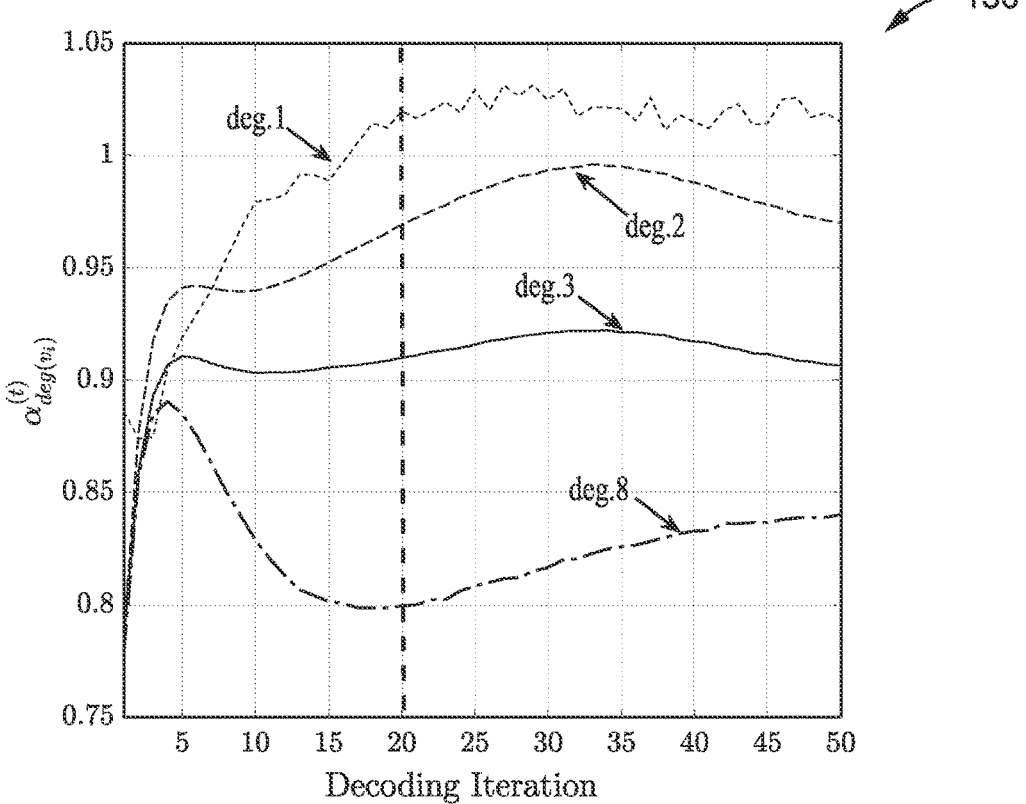

FIG. 7 and FIG. 8 illustrate an example 130, 150 of training weights of the type-2 N-2D-NMS decoder for (16200,7200) DVBS-2 LDPC code, which only changes significantly in the first 20 iterations.

In FIG. 7 is depicted $\beta_{deg(c_i)}^{(t)}$ for degrees 4 through 7, and FIG. 8 illustrates $\alpha_{deg(v_i)}^{(t)}$ for degrees 1 through 3 and 8. The results for the type-2 N-2D-NMS decoder, agree with observations described in the previous section, such as in each decoding iteration, a larger degree node corresponds to a smaller value; and in which the weights change only negligibly after the $20^{th}$ iteration.

Figures 9, 10:
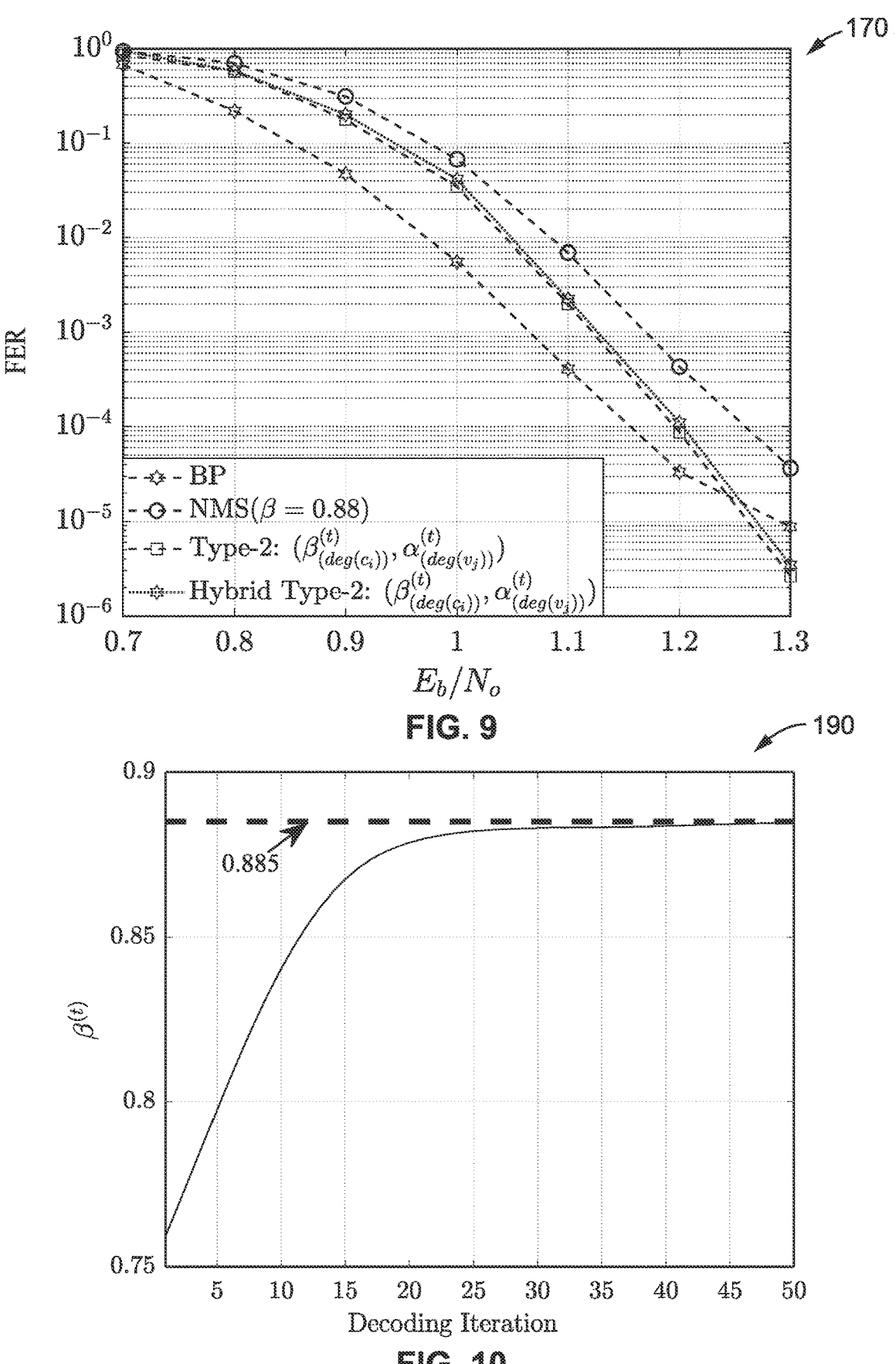
FIG. 9 is a plot of hybrid type-2 N-2D-NMS decoder with I' at 20 showing comparable decoding performance to the original type-2 decoder, as utilized according to an embodiment of the present disclosure.
FIG. 10 is a plot of weights of the Type-8 N-2D-NMS decoder for the (16200,7200) DVBS-2 LDPC code, which converges to 0.885 according to an embodiment of the present disclosure.

FIG. 9 illustrates an example 170 of a hybrid type-2 N-2D-NMS decoder with I'=20 showing a comparable decoding performance to the original type-2 decoder. Thus, this hybrid decoder delivers comparable performance to the full feedforward decoding structure. Specifically, the figure compares FER across for BP, NMS, type-2 and a hybrid type-2 decoder.

FIG. 10 illustrates an example 190 of weights of the Type-8 N-2D-NMS decoder for the (16200,7200) DVBS-2 LDPC code. The figure shows that the parameters of type 8 converge to $\beta^{(t)}$ of 0.885, which is close to the single weight of an NMS decoder. As previously shown in FIG. 6, by only assigning iteration-specific parameters, a N-2D-NMS decoder of type 8 provides an early error floor at 1.20 dB.

3.3. Simulation Results for (3096,1032) PBRL LDPC Code

Figure 11:
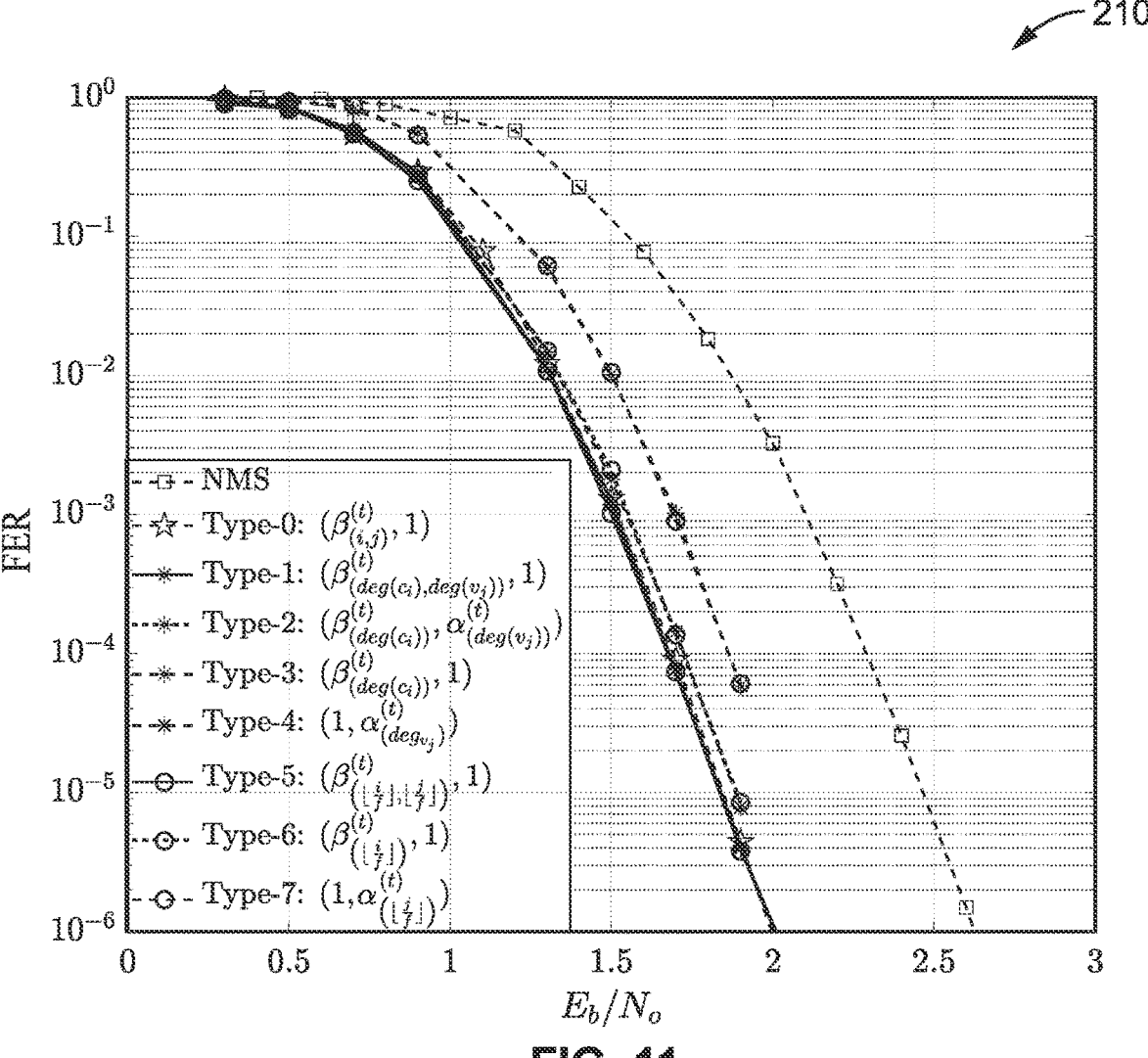
FIG. 11 is a plot of FER performances of various LDPC decoders for (3096,1032) PBRL LDPC code according to an embodiment of the present disclosure.

FIG. 11 illustrates an example 210 of FER performances of various LDPC decoders for a (3096,1032) PBRL LDPC code. The figure compares FER performance of various N-2D-NMS decoders (specifically type 1 through type 7) with the N-NMS (type 0) and NMS. All the decoders are implemented using a layered schedule with a maximum of 10 decoding iterations, by way of example and not limitation. The simulation results show that N-NMS has more than 0.5 dB improvement over the NMS decoder. It can be seen that the figure also simulates N-2D-NMS decoders of types 1 through 7.

It should be noted that the embodiments described as Type 1 and Type 2 have the same decoding performance as the N-NMS decoder, but a significantly reduced number of parameters. Weight-sharing metrics based on check and variable node degree deliver lossless performance with respect to N-NMS. N-2D-NMS decoders of types 4 and 6 have a degradation of around 0.05 dB compared to N-NMS. N-2D-NMS decoders of types 3 and 7 have a degradation of around 0.2 dB compared with N-NMS. Thus, for the (3096, 1032) PBRL code of FIG. 9 assigning weights based only on check nodes is more beneficial than assigning weights only based on the variable node.

4. General Scope of Embodiments

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple implementations of the technology which include, but are not limited to, the following:

A decoder apparatus implemented in a programmable device or an integrated circuit for a low-density parity-check (LDPC) code, comprising: (a) variable nodes connected to check nodes; (b) passing of messages between variable nodes and check nodes; (c) performing weighting in which at least a portion of the messages are weighted using weights determined by a neural network; and (d) wherein groups of said weighted messages that have the same degree for one or more specified nodes are constrained to have the same weight for the same iteration.

A decoder apparatus implemented in a programmable device or an integrated circuit for a low-density parity-check (LDPC) code, comprising (a) variable nodes connected to check nodes; (b) wherein the connections between variable nodes and check nodes are structured according to a proto-graph; (c) passing of messages between variable nodes and check nodes; (d) message weighting in which at least a portion of the messages are weighted using weights determined by a neural network; and (e) wherein weighted edges that correspond to the same row of a protomatrix of the protograph are constrained to have the same weight.

A decoder apparatus implemented in a programmable device or an integrated circuit for a low-density parity-check (LDPC) code, comprising: (a) variable nodes connected to check nodes; (b) wherein connections between variable nodes and check nodes are structured according to a proto-graph; (c)

passing of messages between variable nodes and check nodes; (d) wherein at least a portion of the messages are weighted using weights determined by a neural net-work; and (e) wherein said weighted edges that corre-spond to the same column of the protomatrix of the protograph are constrained to have the same weight.

A method for performing a low-density parity-check (LDPC) in a programmable device or an integrated circuit, comprising: (a) passing of messages between variable nodes and check nodes, in which the variable nodes are connected to the check nodes; (b) performing weighting in which at least a portion of the messages are weighted using weights determined by a neural network; and (c) wherein groups of said weighted messages that have the same degree for one or more specified nodes are constrained to have the same weight for the same iteration.

A method for performing a low-density parity-check (LDPC) in a programmable device or an integrated circuit, comprising: (a) passing of messages between variable nodes and check nodes, wherein said variable nodes and said check nodes are structured according to a protograph; (b) passing of messages between variable nodes and check nodes; (c) message weighting in which at least a portion of the mes-sages are weighted using weights determined by a neural network; and (d) wherein weighted edges that correspond to the same row of a protomatrix of the protograph are con-strained to have the same weight.

A method for performing a low-density parity-check (LDPC) in a programmable device or an integrated circuit, comprising: (a) passing of messages between variable nodes and check nodes, wherein said variable nodes and said check nodes are structured according to a protograph; (b) passing of messages between variable nodes and check nodes; (c) wherein at least a portion of the messages are weighted using weights determined by a neural network; and (d) wherein said weighted edges that correspond to the same column of the protomatrix of the protograph are constrained to have the same weight.

The apparatus or method of any preceding implementa-tion, wherein said weighted messages that are check-to-variable messages are weighted using weights determined by a neural network; and wherein said groups of weighted check-to-variable messages that have the same check node degree are constrained to have the same weight.

The apparatus or method of any preceding implementa-tion, wherein said weighted messages that are check-to-variable messages are weighted using weights determined by a neural network; and wherein said groups of weighted check-to-variable messages that have the same variable node degree are constrained to have the same weight.

The apparatus or method of any preceding implementa-tion, wherein said weighted messages that are check-to-variable messages are weighted using weights determined by a neural network; and wherein said groups of weighted check-to-variable messages that have both the same variable node degree, and the same check node degree are con-strained to have the same weight.

The apparatus or method of any preceding implementa-tion, wherein said weighted messages that are check-to-variable messages are weighted using weights determined by a neural network; wherein the said weighted check-to-variable messages have weights that are the product of two scale factors $\alpha$ and $\beta$; and wherein $\beta$ is determined by the check node degree and $\alpha$ is determined by the variable node degree.

The apparatus or method of any preceding implementa-tion, wherein said weighted messages that are variable-to-check messages are weighted using weights determined by a neural network; and wherein said groups of weighted variable-to-check messages that have the same check node degree are constrained to have the same weight.

The apparatus or method of any preceding implementa-tion, wherein said weighted messages that are variable-to-check messages are weighted using weights determined by a neural network; and wherein said groups of weighted variable-to-check messages that have the same variable node degree are constrained to have the same weight.

The apparatus or method of any preceding implementa-tion, wherein said weighted messages that are variable-to-check messages are weighted using weights determined by a neural network; and wherein said groups of weighted variable-to-check messages that have both the same variable node degree, and the same check node degree are con-strained to have the same weight.

The apparatus or method of any preceding implementa-tion, wherein said weighted messages that are variable-to-check messages are weighted using weights determined by a neural network; wherein said weighted variable-to-check messages have weights that are the product of two scale factors $\alpha$ and $\beta$; and wherein $\beta$ is determined by the check node degree and $\alpha$ is determined by the variable node degree.

The apparatus or method of any preceding implementa-tion, wherein said weighted messages are weighted using weights determined by a neural network trained for opti-mizing dynamic multiplicative weights that can change depending on the variable node degree, check node degree, and iteration.

The apparatus or method of any preceding implementa-tion, wherein the decoder is implemented in a field pro-grammable gate array (FPGA) device.

The apparatus or method of any preceding implementa-tion, wherein the neural network uses both feedforward and recurrent layers so that said weighted messages stop chang-ing with each iteration after a specified number of iterations.

The apparatus or method of any preceding implementa-tion, wherein said weighted messages are trained so that they can change with each iteration.

The apparatus or method of any preceding implementa-tion, wherein said weighted messages are trained so that they remain the same for all iterations.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

Relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing disclosure various features may grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly, the reader should consult the application as filed for the original content of the disclosure. Any deletion of content of the disclosure should not be construed as a disclaimer, forfeiture or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

US 12,574,052 B2

17

TABLE 1

Various N-2D-NMS Decoders and Required Number of Parameters per Iteration

| type | $\beta_*^{(t)}$ | $\alpha_*^{(t)}$ | Number of Parameter Required per Iteration | |
| --- | --- | --- | --- | --- |
| | | | (16200, 7200) DVBS-2 | (3096, 1032) PBRL |
| 0 | $\beta_{(c_i,v_j)}^{(t)}$ | 1 | 4.8e5 | 1.6e4 |
| 1 | $\beta_{(d(c_i),d(v_j))}^{(t)}$ | 1 | 13 | 41 |
| 2 | $\beta_{(d(c_i))}^{(t)}$ | $\alpha_{(d(v_j))}^{(t)}$ | 8 | 15 |
| 3 | $\beta_{(d(c_i))}^{(t)}$ | 1 | 4 | 8 |
| 4 | 1 | $\alpha_{(d(v_j))}^{(t)}$ | 4 | 7 |
| 5 | $\beta_{(\lfloor\frac{i}{f}\rfloor,\lfloor\frac{j}{f}\rfloor)}^{(t)}$ | 1 | — | 101 |
| 6 | $\beta_{(\lfloor\frac{i}{f}\rfloor)}^{(t)}$ | 1 | — | 17 |
| 7 | 1 | $\alpha_{(\lfloor\frac{j}{f}\rfloor)}^{(t)}$ | — | 25 |
| 8 | $\beta^{(t)}$ | 1 | 1 | 1 |

1) $\beta_*^{(t)}$ and $\alpha_*^{(t)}$ are the multiplicative weights assigned to check and variable node messages, respectively.
2) f is lifting factor.

What is claimed is:

1. A decoder for a low-density parity-check (LDPC) code, comprising:

variable nodes connected to check nodes, where the variable nodes and check nodes are implemented in at least one of a programmable device and an integrated circuit;

passing of messages between the variable nodes and the check nodes; and performing weighting in which at least a portion of the messages are weighted using weights determined by a neural network, where neural network is implemented in at least one of a programmable device and an integrated circuit;

wherein groups of said weighted messages that have the same degree for one or more specified nodes are constrained to have the same weight for the same iteration.

2. The apparatus of claim 1:

wherein said weighted messages that are check-to-variable messages are weighted using weights determined by the neural network; and wherein said groups of weighted check-to-variable messages that have the same check node degree are constrained to have the same weight.

3. The apparatus of claim 1:

wherein said weighted messages that are check-to-variable messages are weighted using weights determined by the neural network; and wherein said groups of weighted check-to-variable messages that have the same variable node degree are constrained to have the same weight.

4. The apparatus of claim 1:

wherein said weighted messages that are check-to-variable messages are weighted using weights determined by the neural network; and wherein said groups of weighted check-to-variable messages that have both the same variable node degree, and the same check node degree are constrained to have the same weight.

18

5. The apparatus of claim 1:

wherein said weighted messages that are check-to-variable messages are weighted using weights determined by the neural network;

wherein the said weighted check-to-variable messages have weights that are the product of two scale factors $\alpha$ and $\beta$; and wherein $\beta$ is determined by the check node degree and $\alpha$ is determined by the variable node degree.

6. The apparatus of claim 1:

wherein said weighted messages that are variable-to-check messages are weighted using weights determined by the neural network; and wherein said groups of weighted variable-to-check messages that have the same check node degree are constrained to have the same weight.

7. The apparatus of claim 1:

wherein said weighted messages that are variable-to-check messages are weighted using weights determined by the neural network; and wherein said groups of weighted variable-to-check messages that have the same variable node degree are constrained to have the same weight.

8. The apparatus of claim 1:

wherein said weighted messages that are variable-to-check messages are weighted using weights determined by the neural network; and wherein said groups of weighted variable-to-check messages that have both the same variable node degree, and the same check node degree are constrained to have the same weight.

9. The apparatus of claim 1:

wherein said weighted messages that are variable-to-check messages are weighted using weights determined by the neural network;

wherein said weighted variable-to-check messages have weights that are the product of two scale factors $\alpha$ and $\beta$; and wherein $\beta$ is determined by the check node degree and $\alpha$ is determined by the variable node degree.

10. The apparatus of claim 1, wherein said weighted messages are weighted using weights determined by the neural network trained for optimizing dynamic multiplicative weights that can change depending on the variable node degree, check node degree, and iteration.

11. The apparatus of claim 1, wherein the decoder is implemented in a field programmable gate array (FPGA) device.

12. The apparatus of claim 1, wherein the neural network uses both feedforward and recurrent layers so that said weighted messages stop changing with each iteration after a specified number of iterations.

13. The apparatus of claim 1, wherein said weighted messages are trained so that they can change with each iteration.

14. The apparatus of claim 1, wherein said weighted messages are trained so that they remain the same for all iterations.

15. A decoder for a low-density parity-check (LDPC) code, comprising:

variable nodes connected to check nodes, where the variable nodes and check nodes are implemented in at least one of a programmable device and an integrated circuit;

wherein the connections between variable nodes and check nodes are structured according to a protograph having a protomatrix;

passing of messages between the variable nodes and the check nodes;

message weighting in which at least a portion of the messages are weighted using weights determined by a neural network, where the neural network is implemented in at least one of a programmable device and an integrated circuit; and wherein weighted edges that correspond to the same row of a protomatrix of the protograph are constrained to have the same weight.

16. A decoder for a low-density parity-check (LDPC) code, comprising:

variable nodes connected to check nodes, where the variable nodes and check nodes are implemented in at least one of a programmable device and an integrated circuit;

wherein connections between variable nodes and check nodes are structured according to a protograph having a protomatrix;

passing of messages between the variable nodes and the check nodes;

wherein at least a portion of the messages are weighted using weights determined by a neural network, where the neural network is implemented in at least one of a programmable device and an integrated circuit; and wherein said weighted edges that correspond to the same column of the protomatrix of the protograph are constrained to have the same weight.

\* \* \* \* \*